United States Patent
Kamath et al.

(10) Patent No.: US 6,562,729 B2
(45) Date of Patent: May 13, 2003

(54) SILICON NITRIDE AND SILICON DIOXIDE GATE INSULATOR TRANSISTORS AND METHOD OF FORMING SAME IN A HYBRID INTEGRATED CIRCUIT

(75) Inventors: Arvind Kamath, Mountain View, CA (US); Rajiv Patel, San Jose, CA (US); Mohammad Mirabedini, Daly City, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/171,700

(22) Filed: Jun. 14, 2002

(65) Prior Publication Data

US 2002/0151188 A1 Oct. 17, 2002

Related U.S. Application Data

(62) Division of application No. 09/723,516, filed on Nov. 28, 2000, now Pat. No. 6,436,845.

(51) Int. Cl.$^7$ .......................... H01L 21/31; H01L 21/469
(52) U.S. Cl. ........................................ 438/769; 438/791
(58) Field of Search ................................. 438/264, 763, 438/768, 769, 981, 787, 791

(56) References Cited

U.S. PATENT DOCUMENTS

5,241,208 A  *  8/1993  Taguchi

* cited by examiner

Primary Examiner—David Nelms
Assistant Examiner—Phuc T. Dang
(74) Attorney, Agent, or Firm—Luedeka, Neely & Graham, P.C.

(57) ABSTRACT

Silicon nitride gate insulators for digital transistors and silicon dioxide gate insulators for analog transistors of a hybrid integrated circuit (IC) are formed in a single integrated fabrication process. A first area of a silicon substrate of the IC is exposed while a second area is initially covered by a silicon dioxide layer. A layer of silicon nitride is formed on the exposed first area while the initial silicon dioxide layer inhibits the formation of silicon nitride on the second area. Thereafter the initial silicon dioxide layer is removed from the second area to allow a new silicon dioxide layer to be formed there from the exposed silicon substrate. The silicon dioxide layer shields against the adverse influences from silicon nitride formation and permits the initial silicon dioxide layer to be removed by etching. The silicon nitride layer shields against the adverse influences of oxidizing new silicon dioxide layer. A slight, beneficial silicon dioxide interface is created between the silicon nitride and the silicon substrate as a result of oxidizing the new layer of silicon dioxide.

4 Claims, 4 Drawing Sheets

SILICON NITRIDE AND SILICON DIOXIDE GATE INSULATOR TRANSISTORS AND METHOD OF FORMING SAME IN A HYBRID INTEGRATED CIRCUIT

This is a divisional of application Ser. No. 09/723,516 filed Nov. 28, 2000, now U.S. Pat. No. 6,436,845.

CROSS-REFERENCE TO RELATED APPLICATION

This invention is related to an invention for a Method of Reducing Silicon Oxynitride Gate Insulator Thickness in Some Transistors of a Hybrid Integrated Circuit to Obtain Increased Differential in Gate Insulator Thickness with Other Transistors of the Hybrid Circuit, described in U.S. patent application Ser. No. (LSI Docket 00-076), which is filed concurrently herewith, invented by some of the present inventors, and assigned to the assignee of the present invention. The subject matter of this concurrently filed application is incorporated herein by this reference.

FIELD OF THE INVENTION

This invention relates to semiconductor integrated circuits (ICs) of the type which incorporate transistors having relatively thin gate insulators, such as digital switching transistors, and transistors having relatively thick gate insulators, such as analog linearly-responsive transistors, on the same substrate. ICs which incorporate digital and analog transistors on the same substrate are sometimes referred to as Ahybrid @ ICs. This invention also relates to methods of manufacturing hybrid ICs. More particularly, the present invention relates to a new and improved method of fabricating transistors having a relatively thin gate insulator of silicon nitride and transistors having a relatively thick gate insulator of silicon dioxide, in a singular fabrication process where the formation of the silicon nitride does not adversely influence the formation of the silicon dioxide, and vice versa. The relatively thinner silicon nitride gate insulator of the digital transistors alleviates a problem of leakage current from quantum mechanical tunneling between the gate and substrate while the relatively thicker silicon dioxide gate insulator of the analog transistors maintains desired linear response characteristics of the analog circuitry of the hybrid IC.

BACKGROUND OF THE INVENTION

Recent evolutions of semiconductor IC electronics have combined digital and analog circuitry on the same chip or substrate. Such ICs are known as Asystems on a chip, @ system level integrated circuits (SLICs) or application specific and integrated circuits (ASICs). The combination digital and analog circuitry on the same IC is also sometimes referred to as Ahybrid @ or Amixed signal @ technology. Combining digital and analog circuitry on a hybrid IC simplifies the construction of many electrical devices which require both digital and analog signals. A single hybrid IC may be used in place of multiple ICs. Previously, it was typical practice to separate the digital circuitry and the analog circuitry, with each type of circuitry confined to its own separate IC and IC package. It was then necessary to connect the separate ICs together with a printed circuit or other connection. Combining the digital and analog circuitry on the same hybrid IC reduces the cost, complexity and size of the electronic circuitry compared to connecting separate digital and analog circuit ICs.

Digital and analog circuitry have somewhat different functional considerations, and satisfying those considerations simultaneously has imposed significant constraints on the semiconductor fabrication techniques used to manufacture hybrid ICs. Since both the digital and analog circuitry must be fabricated on the same substrate, the analog and digital components must be formed simultaneously when fabricating the single hybrid IC. The semiconductor fabrication techniques and processes used for such hybrid circuits must accommodate and secure the required functional behavior of both the digital and analog circuitry. Since semiconductor fabrication techniques may be oriented to optimize the performance of the digital circuitry or the analog circuitry, but usually not both, it is typical that most hybrid ICs are formed by semiconductor fabrication technology which somewhat compromises both the digital and analog functional characteristics.

One area of compromise relates to the functional requirements of the digital switching transistors and the analog linear transistors. Generally speaking, the digital switching transistors operate at a lower voltage on the hybrid IC, typically in the neighborhood of approximately 1.0–1.5 volts. The lower voltages are used because less power is consumed and because the on/off, conductive/nonconductive characteristics of the digital switching transistors do not require a linear response between their conductive and nonconductive states. Instead, the primary consideration with respect to digital transistors is achieving higher frequency or higher speed switching rates. In contrast, the analog linear transistors require a larger operating voltage, typically in the neighborhood of approximately 2.5–5.0 volts. The higher voltage is required to develop a sufficient magnitude for the analog signals and to provide the analog transistors with enough voltage range to allow them to operate in their linear transconductance or response range.

The differing functional requirements for digital and analog transistors are revealed perhaps most significantly in regard to the thickness of the gate insulator used in each type of transistor. In digital switching transistors, the gate insulator is kept as thin as possible, because the thinner insulator will result in higher frequency switching capability. Also, the lower operating voltages of digital switching transistors require a thinner insulator to maximize driving current. In analog linear transistors, the gate insulator is kept relatively thick, because a relatively thick gate insulator more effectively establishes linear response characteristics with better noise immunity. The higher operating voltages are also better tolerated by a thicker gate insulator, particularly for reliability considerations. However, in hybrid ICs, where the gate insulators of both the digital and analog transistors must be formed simultaneously, it has been particularly challenging to achieve semiconductor fabrication techniques which permit a relatively thinner gate insulator for the digital transistors and a relatively thicker gate insulator for the analog transistors.

Silicon dioxide is the typical substance used to form the gate insulators of the transistors. Silicon dioxide is formed by oxidizing silicon, which may be performed to form the gate insulators of all of the transistors approximately at the same time within the semiconductor fabrication process. Silicon oxynitride is also sometimes used as a gate insulator, particularly for the thinner gate insulators of the digital transistors. Silicon oxynitride may also be formed by an oxidation step which also simultaneously forms silicon dioxide for the thicker gate insulators of the analog transistors. Formation of the relatively thinner silicon oxynitride gate insulators simultaneously with the relatively thicker silicon dioxide gate insulators is a convenient and effective fabrication step because of the compatibility in forming both substances simultaneously in a single oxidation step.

One problem with relatively thin silicon dioxide or silicon oxynitride gate insulators for the digital transistors is excessive leakage current between a gate and a channel formed in the substrate of the digital transistor. Leakage current detracts or diminishes the performance of the digital transistor. An excessive leakage current can result in very high power dissipation and in the extreme case can disable a digital transistor and render the entire hybrid IC useless. Leakage current results from direct quantum mechanical tunneling of the electrons and holes in the semiconductor material between the gate and the channel. A relatively thin silicon oxynitride or silicon dioxide gate insulator has insufficient dielectric capabilities to prevent such tunneling.

One recognized technique of reducing gate leakage current is to incorporate nitrogen into the relatively thinner gate insulator. An increased nitrogen content has the effect of blocking or inhibiting the tunneling effect of the electrons and holes. Prior art attempts to increase the nitrogen content have involved forming the gate insulator of a thin amount of silicon dioxide and then annealing the thin silicon dioxide gate insulator in a nitriding ambient such as nitric oxide or ammonia. However, this approach is limited by the thermodynamic limit of the post oxidation annealing process, and typically results in no more than an increase of two to five atomic percent of nitrogen in the relatively thin silicon dioxide gate insulator. Increasing the nitrogen content in this limited amount is only of marginal assistance, and obtains only a slight reduction in leakage current. Moreover, the annealing process also adversely affects the relatively thick silicon dioxide gate insulator of the analog transistors. The nitrogen atoms introduced by the annealing process introduce charge instability and flicker noise influences which adversely affect the performance and stability of the analog transistors.

Silicon oxynitride gate insulators offer better resistance to leakage current than silicon dioxide gate insulators. However, in general silicon oxynitride gate insulators degrade the mobility of electronic carriers (electrons and holes) and thereby reduce the speed or switching frequency of the transistor. Consequently, silicon oxynitride gate insulators for digital switching transistors are somewhat of compromise between reducing the detrimental effects of leakage current and introducing a diminished performance in higher frequency switching capability. The above identified invention is the first known technique of introducing relatively large amounts of nitrogen in a relatively thin gate insulator to reduce leakage current in a hybrid circuit which also has relatively thick gate insulators in other transistors.

Thin layers of silicon nitride offer the possibility of a characteristic capability to block leakage current. However, silicon nitride is not believed to have been previously used as a thin gate insulator material for digital transistors in a hybrid circuit. The hybrid IC semiconductor fabrication steps necessary to form silicon nitride have been incompatible with the fabrication steps required to form silicon dioxide. Since silicon dioxide is required or desired to achieve the desired linear characteristics from the analog transistors of the hybrid circuit, it is not feasible to replace the thick silicon dioxide gate insulators of the analog transistors with silicon nitride. The relatively large thickness of silicon nitride required for the gate insulators of analog transistors would actually create a worse leakage current characteristic than silicon dioxide. Large thicknesses of silicon nitride may also create certain charge instability and flicker noise problems from nitrogen-induced charges, thereby detracting from its use as a thick gate insulator for analog transistors.

The incompatibilities in combining a silicon nitride fabrication step with a silicon dioxide fabrication step in a hybrid IC fabrication process are significant. Typical silicon nitride based semiconductor fabrication processes involve chemical vapor deposition (CVD) of silane and ammonia on the silicon substrate, or an ammonia reaction with the silicon substrate, Exposing an already formed silicon dioxide layer to silane or ammonia can create undesirable electrical properties from the nitrogen and hydrogen nitriding the silicon dioxide. The problem becomes worse with longer exposures of silane and ammonia. Thermodynamically, silicon has a preference to bond with oxygen as opposed to nitrogen. Another issue of incompatibility relates to the silicon surface upon which the silicon nitride is formed. Masking, etching and stripping this surface in an oxidizing solution results in a chemical oxide layer (about 8 angstroms of silicon dioxide) in the area intended for the silicon nitride formation. The CVD of silane or ammonia will not readily occur in the areas where this amount of silicon dioxide is present. Removal of the silicon dioxide in hydrofluoric acid to provide a desirable bare silicon surface also etches the already formed silicon dioxide gate insulator layer rendering it uncontrollable in thickness. Other factors also contribute to incompatibility of forming silicon nitride and silicon dioxide layers in a singular hybrid IC fabrication process.

It is with respect to these and other considerations that the present invention has evolved.

SUMMARY OF THE INVENTION

The present invention involves fabricating digital switching transistors with a relatively thinner silicon nitride-based gate insulator and analog linear transistors with a relatively thicker silicon dioxide gate insulator, using a singular, compatible, hybrid IC fabrication and gate insulator formation process. The present invention also teaches a singular compatible technique for incorporating re-oxidized silicon nitride into a silicon dioxide process where the influences of the silicon nitride process steps do not detrimentally influence the silicon dioxide process steps, and vice versa. The invention also makes it possible to use relatively thin re-oxidized silicon nitride as a gate insulator for high frequency digital switching transistors on a hybrid circuit, while relatively thick silicon dioxide is used for the relatively thick gate insulators of the analog transistors. In addition, the invention allows re-oxidized silicon nitride to be used as a thin gate insulator as an alternative to silicon dioxide or conventionally-formed silicon oxynitride in a hybrid IC fabrication process with relatively small nitrogen levels. Another aspect of the invention of relates to fabricating thinner gate insulators for transistors in a hybrid IC which offer enhanced resistance to direct quantum mechanical tunneling of electrons and holes between the gate and the channel of the transistor, to thereby diminish leakage current in those transistors of a hybrid circuit which have thin gate insulators. The invention also relates to a hybrid circuit fabrication technique which permits re-oxidized silicon nitride to be used as gate insulators for some of the transistors while silicon dioxide is used as the gate insulators for other transistors of the hybrid circuit. Furthermore, the invention involves a gate insulator fabrication technique for hybrid ICs which achieves a greater differential in the relative thicknesses of the gate insulators of the digital transistors and the analog transistors. Last among other things, the invention involves the fabrication of high performance, high frequency switching digital transistors in combination with analog transistors which have good linear response characteristics on a hybrid IC.

These and other aspects are accomplished in a method of forming re-oxidized silicon nitride gate insulators for a first type of transistor, preferably digital switching transistors, and forming silicon oxide gate insulators for a second different type of transistor, preferably analog transistors. The first and second transistors are formed on the silicon substrate of single integrated circuit. A first area of the silicon substrate where the gate insulators of the first transistors are to be formed is exposed, and an initial layer of silicon dioxide is formed on the silicon substrate in a second area where the gate insulators of the second transistors are to be formed. The first and second areas are separate from one another. A layer of silicon nitride is formed on the exposed silicon substrate in the first area while the initial silicon dioxide layer inhibits the formation of silicon nitride on the second area. The initial silicon dioxide layer from the second area is removed to expose the silicon substrate after the silicon nitride layer has been formed. A new layer of silicon dioxide is then formed into the silicon substrate of the second area. The gate insulators for the first transistors are formed from the silicon nitride layer, and the gate insulators for the second transistors are formed from the new layer of silicon dioxide.

The silicon nitride layer is formed under circumstances where the silicon dioxide layer prevents the silicon nitride from forming on the silicon dioxide. Even then, the initial layer of silicon dioxide is removed and a new layer of silicon dioxide is formed after the silicon nitride has been formed. Thus, each of the silicon nitride and silicon dioxide layers are formed in a manner where forming of each layer does not adversely affect the formation of the other layer. A single integrated process can therefore be used to form the gate insulators for both types of transistors approximately simultaneously in a single hybrid IC fabrication process. Moreover, since the silicon nitride and the silicon dioxide gate insulator layers are formed in separate steps of the integrated process, the thickness of each layer may be independently controlled to obtain independent characteristics from each layer. The better resistance to leakage current and the thinner thickness of the silicon nitride digital transistor gate insulators are achieved independently of the thicker and more desired characteristics of the silicon dioxide analog transistor gate insulators. Preferably the silicon nitride gate insulators for the digital transistors have an equivalent thickness in the range of 10–30 angstroms, while the silicon dioxide gate insulators for the analog transistors have a thickness of at least 60 angstroms. The re-oxidized silicon nitride preferably contains approximately 20 atomic percent nitrogen to reduce quantum tunneling of carriers between the gate and the channel of the digital transistors. The re-oxidized silicon nitride gate of the digital transistors thereby reduces leakage current while achieving better resistance to the higher voltages present on the hybrid IC as result of the analog circuitry.

Other preferable aspects of the method include creating a silicon dioxide interface between the silicon nitride and the silicon substrate in the first area. The silicon dioxide interface preferably is formed while oxidizing the silicon to form the new layer of silicon dioxide in the second area. Any traps and defects in the silicon nitride layer which may have been created when forming the silicon nitride layer are removed by oxidizing the silicon nitride layer, thereby diminishing any tendency of the silicon nitride toward instability or flicker noise problems. The silicon nitride layer is preferably formed by chemical vapor deposition, with ammonia treatment of the silicon surface. The initial silicon dioxide layer is preferably etched in hydrofluoric acid to remove the initial silicon dioxide layer from the second area.

In a more encompassing and preferable sense, the method of the present invention also involves forming the initial layer of silicon dioxide on the first area in addition to the second area prior to exposing the first area, applying a mask material to the initial layer of silicon dioxide on the second area after the initial layer of silicon dioxide has been formed on the first area, and etching the initial layer of silicon dioxide on the first area into a layer having a lesser thickness than the thickness of the initial layer of silicon dioxide on the second area while the mask material remains applied to the initial layer of silicon dioxide on the second area. Thereafter, the mask material from the initial layer of silicon dioxide on the second area is removed while the lesser thickness layer of silicon dioxide remains on the first area. The lesser thickness layer of silicon dioxide on the first area is next etched to expose the first area of the silicon substrate while the initial layer of silicon dioxide on the second area is simultaneously etched into a lesser thickness prior to forming the layer of silicon nitride on the exposed first area of the silicon substrate. The silicon dioxide layers are bathed or dipped in hydrofluoric acid to etch away the silicon dioxide layers. The mask material is removed by using one of a sulfuric acid oxidizer or a plasma asher in combination with a sulfuric acid oxidizer, while the lesser thickness layer of silicon dioxide remains on the first area to protect the silicon substrate in the first area.

Another significant aspect of the present invention is a hybrid integrated circuit containing high frequency digital switching transistors and analog linear response transistors formed on a silicon substrate wherein each transistor has a gate insulator and the gate insulators of the digital transistors are substantially silicon nitride and the gate insulators of the analog transistors are substantially silicon dioxide. The silicon dioxide gate insulators of the analog transistors are preferably substantially greater in thickness than the thickness of the silicon nitride gate insulators of the digital transistors, for example at least 60 angstroms for the thickness of the silicon dioxide gate insulators and in the range of 10–30 equivalent angstroms for the thickness of the silicon nitride gate insulators. A silicon dioxide interface between the silicon nitride gate insulators and the silicon substrate is also preferably present.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

DETAILED DESCRIPTION

Figure 1:
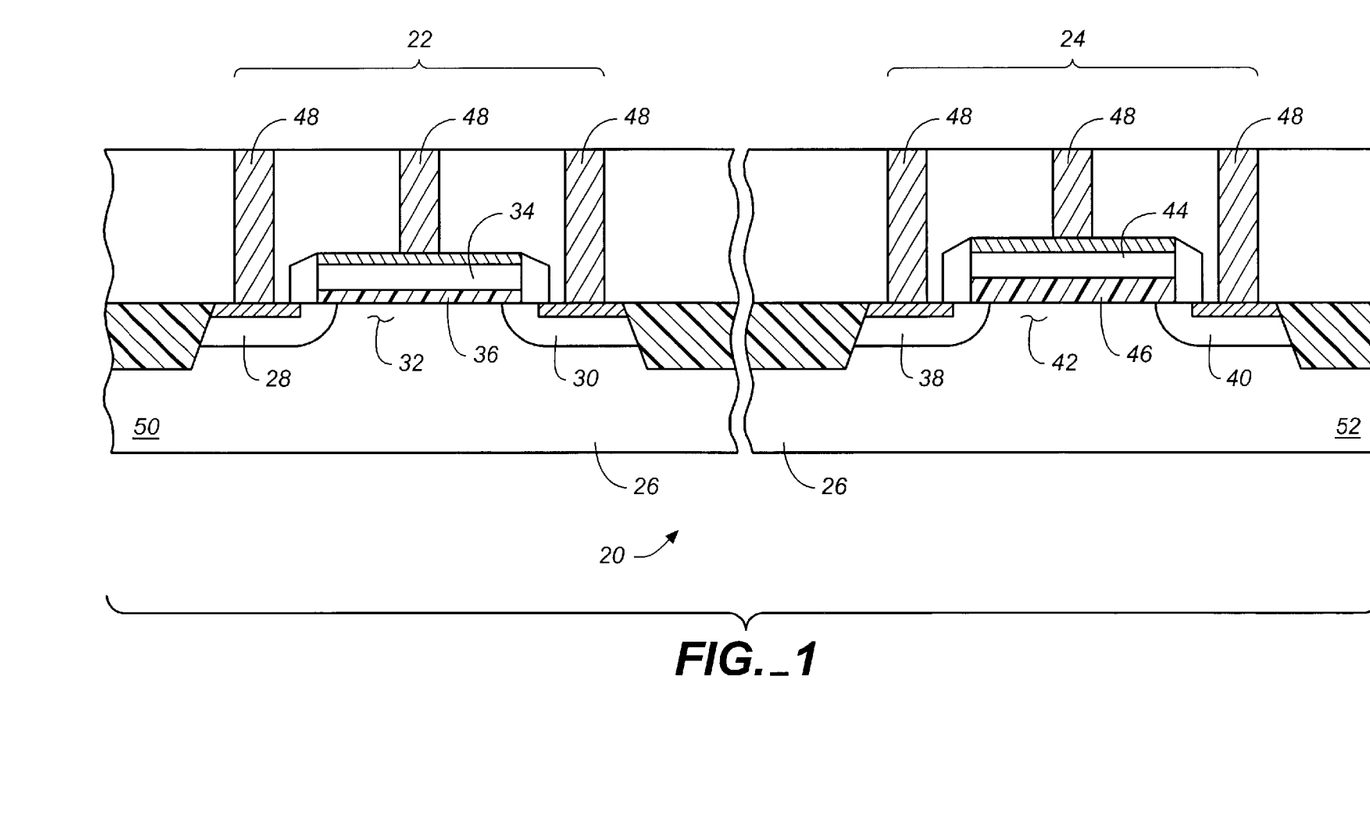
FIG. 1 is a simplified, broken, cross-sectional view of a portion of a hybrid integrated circuit in which the present invention is incorporated and which has been fabricated according to the present invention.

A portion of a hybrid integrated circuit (IC) 20 which incorporates the present invention and which is formed by the methodology of the present invention is shown in FIG. 1. The IC 20 includes a digital switching transistor structure 22 and an analog linear transistor structure 24, both of which are formed in a common silicon substrate 26 of the IC 20. The digital transistor 22 includes a source region 28 and a drain region 30 which are formed in the substrate 26 and which are separated by a channel 32 which extends in the substrate 26 between the source and drain regions 28 and 30. The digital transistor 22 also includes a gate 34 which is separated by and insulated from the channel 32 by a digital transistor gate insulator region or layer 36 of silicon nitride. At another location on the IC 20, the analog transistor 24 also includes its own source region 38 and drain region 40 which are also formed in the silicon substrate 26. A channel 42 extends through the substrate 26 between the source and drain regions 38 and 40. A gate 44 of the analog transistor 24 is separated by and insulated from the channel 42 by an analog transistor gate insulator region or layer 46 of silicon dioxide. The transistor structures 22 and 24 are formed in a single integrated hybrid IC fabrication process using conventional individual steps in the process, except with respect to the fabrication of the silicon nitride digital gate insulator 36 and the fabrication of the silicon dioxide analog gate insulator 46.

Separate power supply voltages are supplied to the digital transistor 22 and to the analog transistor 24, by conventional conductors 48 which connect to the source, drain and gate regions of the transistors 22 and 24. The digital transistor 22 typically operates from a relatively lower power supply voltage, for example 1.0–1.5 volts. The analog transistor 24 utilizes a relatively higher power supply voltage, for example 2.5–5.0 volts. The separate power supply voltages are derived from external sources (not shown), but both different levels of voltage are present in the same IC 20 and with respect to the same substrate 26.

As shown in FIG. 1, the digital gate insulator 36 has considerably less thickness (measured in a vertical dimension) than the thickness of the analog gate insulator 46. A relatively thinner digital gate insulator 36 is desirable because it imparts to the digital transistor 22 the capabilities of a higher frequency switching and greater drive current at low voltage. A relatively high frequency switching capability is a very desirable characteristic of the digital transistor 22, as is known and discussed above. The relatively thicker analog gate insulator 46 is also desirable because it imparts a greater capability to withstand the higher voltages applied to the analog transistor 24 without breaking down, and the relatively thicker analog gate insulator 46 obtains a more linear transconductance and response characteristic from the analog transistor 24. Linear response characteristics are essential for the proper functionality of the analog circuit, as is known and described above.

In conventional prior art hybrid ICs, the digital gate insulator 36 is typically less thick than the analog gate insulator 46. While it is recognized that a thinner digital gate insulator 36 will result in higher frequency switching capabilities in the digital transistor 22, the most minimal thickness which is believed to have been obtained before the above-identified invention for digital gate insulators 36 is in the neighborhood of 22–29 angstroms, while maintaining a 60 angstroms thick gate insulator on other transistors, depending on oxidizing conditions. On the other hand, an exemplary thickness of a silicon dioxide analog gate insulator 46 should be approximately 60 angstroms for 3.3 volt operation. The present invention provides an effective technique for reducing the thickness of the digital gate insulator 36 by fabricating it from silicon nitride, to obtain higher frequency switching capability and to obtain diminished leakage current from greater resistance to direct quantum mechanical tunneling of electrons and holes between the gate and the channel of the transistor. The silicon nitride gate insulator 36 of the digital transistor does not reduce or negatively impact the desirable, relatively greater thickness of the analog gate insulator 46, thereby achieving a greater difference in the relative thicknesses of the digital and analog gate insulators for the digital and analog transistors, respectively, of a hybrid IC. As is discussed below in connection with FIGS. 2–9, the silicon nitride gate insulator 36 may be formed in the same fabrication process which forms the silicon oxide gate insulator 46, without the formation of either gate insulator 36 or 46 negatively influencing the other gate insulator.

Figure 2:
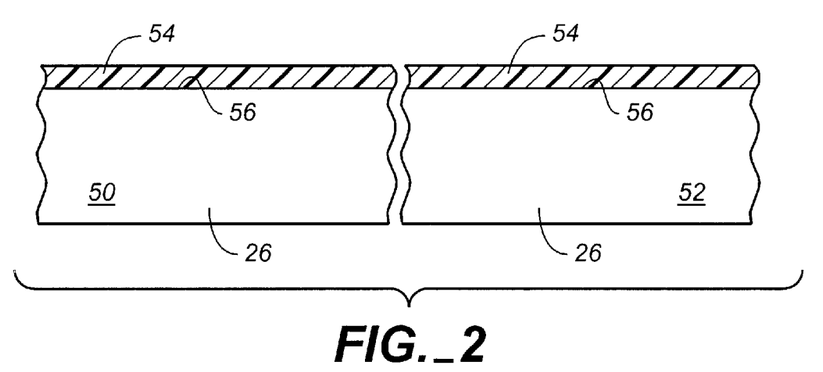
FIGS. 2–9 are enlarged, broken, cross-sectional views of portions of the hybrid integrated circuit shown in FIG. 1, which show prior art steps involved in the fabrication of the hybrid integrated circuit shown in FIG. 1.

The first step in a method of simultaneously forming the silicon nitride digital gate insulator 36 (FIG. 1) and the silicon dioxide analog gate insulator 46 (FIG. 1) in accordance with the present invention is shown in FIG. 2. One area 50 of the silicon substrate 26 is intended for the fabrication of the transistors having thin gate insulators, such as digital switching transistors 22 (FIG. 1), and another area 52 of the substrate 26 is intended for the fabrication of transistors having thick gate insulators, such as analog linear transistors 24 (FIG. 1). The single silicon substrate 26 may contain multiple digital transistor areas 50 and analog transistor areas 52 at various different locations, since the digital circuitry and the analog circuitry may be disbursed at multiple locations within the hybrid IC 20 (FIG. 1).

Initially, a relatively thick layer 54 of sacrificial silicon dioxide is formed into an upper surface of the silicon substrate 26. Preferably, the relatively thick layer 54 of silicon dioxide is formed to a depth of approximately 100 angstroms, stopping at an upper, unaffected surface 56 of the silicon substrate 26. The silicon dioxide layer 54 is formed into the substrate 26 using conventional oxidation techniques. The thickness of the silicon dioxide layer 54 is not particularly critical, because as will be seen from the following discussion, the silicon dioxide layer 54 is ultimately stripped from the substrate 26 leaving the surfaces 56 exposed for subsequent process steps at different times in the process.

Figure 3:
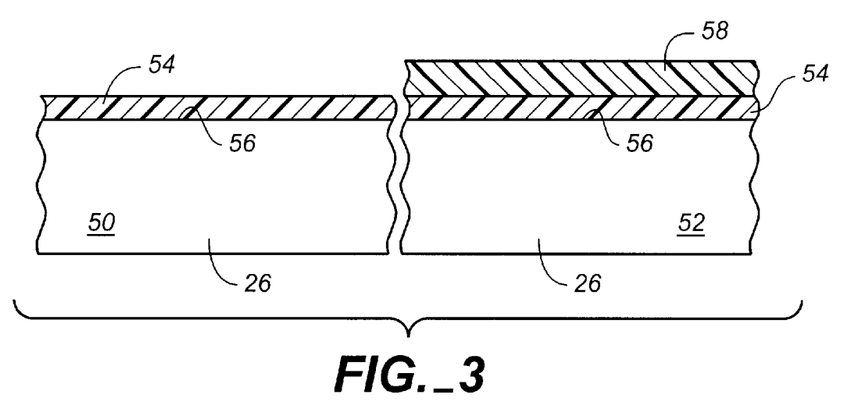

Next as shown in FIG. 3, a relatively thick mask layer 58 is formed on the silicon dioxide layer 54 above the analog transistor area 52. The mask layer 58 is preferably formed of photoresist material which is deposited and patterned in a conventional manner. The mask layer 58 of photoresist material covers the silicon dioxide layer 54 above analog transistor area 52 but leaves the silicon dioxide layer 54 above the digital transistor area 50 exposed.

Figure 4:
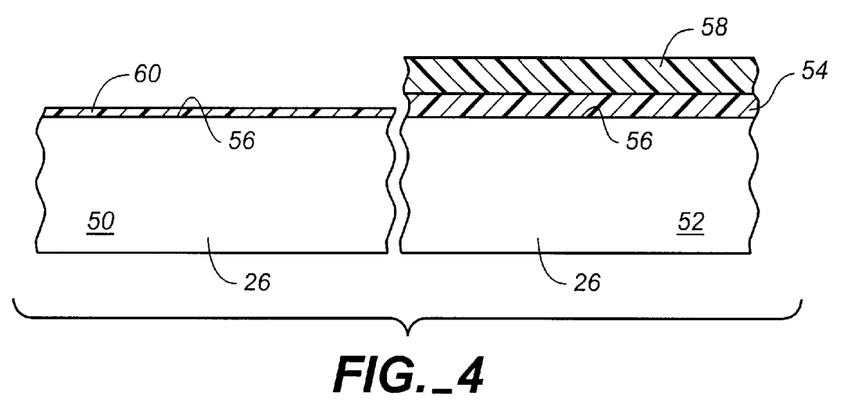

The entire structure is thereafter subjected to a dilute bath or dip of hydrofluoric acid, as illustrated by FIG. 4. The hydrofluoric acid etches the silicon dioxide layer 54 in the area 50, while the silicon dioxide layer 54 covered by the mask 58 in the area 52 is not affected or etched. The application of the etching step is timed so that almost all of the silicon dioxide layer 54 in the area 50 is removed, until a very thin layer 60 of approximately 20 angstroms of the original layer 54 of silicon dioxide remains on the surface 56 in the area 50.

Figure 5:
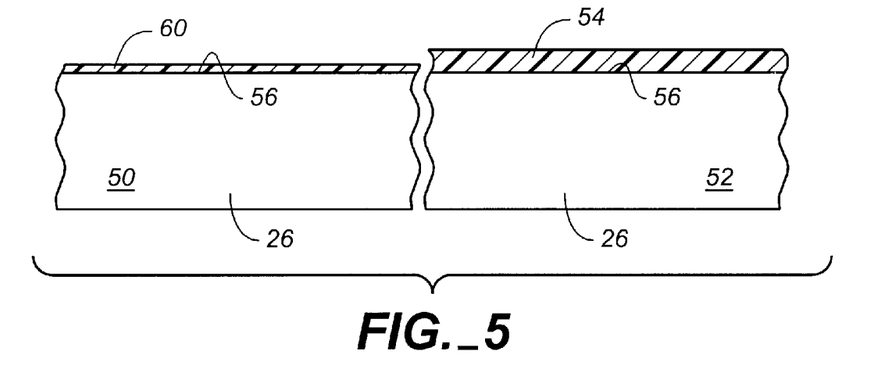

As illustrated from FIG. 5, the thin layer 60 of silicon dioxide protects the surface 56 of the substrate 26 in the area 50 when the mask 58 is removed. The mask 58 is removed in a conventional manner, preferably using a sulfuric acid oxidizer or by using a plasma asher in combination with a sulfuric acid oxidizer.

Figure 6:
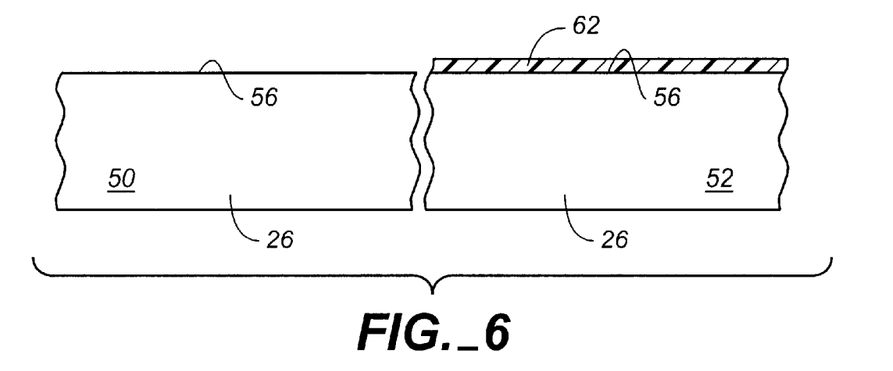

Next, as shown in FIG. 6, the exposed thin layer 60 and thick layer 54 of silicon dioxide in the areas 50 and 52, respectively, are subjected to further etching, preferably in a dip or bath of hydrofluoric acid. The hydrofluoric acid attacks and removes the silicon dioxide. The application of the hydrofluoric acid to the layers 60 and 54 (FIG. 5) is timed so that the relatively thin layer 60 is completely stripped from the surface 56 of the substrate 26 in the area 50 as shown in FIG. 6. Of course, completely removing the thin layer 60 (FIG. 5) of silicon dioxide also diminishes the thickness of the silicon dioxide layer 54 (FIG. 5) until a reduced thickness layer 62 of the initial layer of silicon dioxide remains on the surface 56 of the area 52. The thickness of the silicon dioxide layer 62 should not be diminished to less than approximately 20 angstroms, but a greater thickness of the layer 62 is also acceptable. The layer 62 of silicon dioxide is intended to serve as a barrier during the application of silicon nitride to the surface 56 above the area 50.

Figure 7:
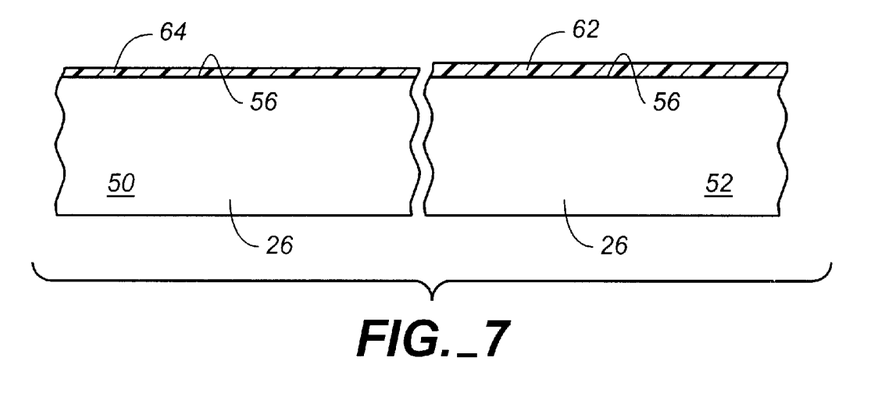

As shown in FIG. 7, a relatively thin layer 64 of silicon nitride is deposited on the exposed surface 56 of the area 50, preferably by conventional chemical vapor deposition (CVD) techniques or by light ammonia nitridation of the silicon surface. Preferably, the thin layer 64 of silicon nitride is approximately 10 to 30 angstroms thick. The amount of silicon nitride deposited in the layer 64 establishes the desired thickness of the gate insulator 36 of the digital transistor 22 (FIG. 1). The silicon nitride is deposited by CVD over the entire semiconductor structure, but the silicon nitride does not nucleate on the layer 62 of silicon dioxide. By adjusting the CVD process for depositing the silicon nitride, essentially no silicon nitride is formed on the silicon dioxide layer 62. However, the silicon nitride readily forms on the silicon dioxide-free, exposed silicon surface 56 above the area 50.

Figure 8:
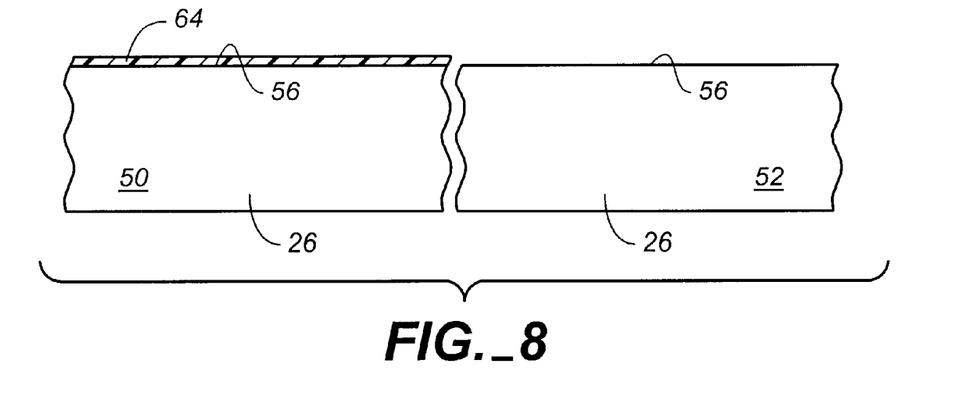

The layer 62 (FIG. 7) of silicon dioxide is next removed or etched away, as shown in FIG. 8, preferably by subjecting the semiconductor structure to a bath or dip of hydrofluoric acid. The hydrofluoric acid readily attacks the silicon dioxide layer 62, but the silicon nitride layer 64 is not affected by the hydrofluoric acid. The silicon nitride layer 64 remains intact, while the hydrofluoric acid completely strips and removes the layer 62 of silicon dioxide. The fact that none of the silicon nitride nucleated on the silicon dioxide layer 62 (FIG. 7) allows the hydrofluoric acid to readily etch away the silicon dioxide layer 62 and expose the upper surface 56 of silicon 26 above the area 52, as shown in FIG. 8. Using a mixture of the hydrofluoric and hydrochloric acid further improves the selectivity for etching the silicon dioxide layer 62 (FIG. 7) while the silicon nitride layer 64 remains unaffected.

Figure 9:
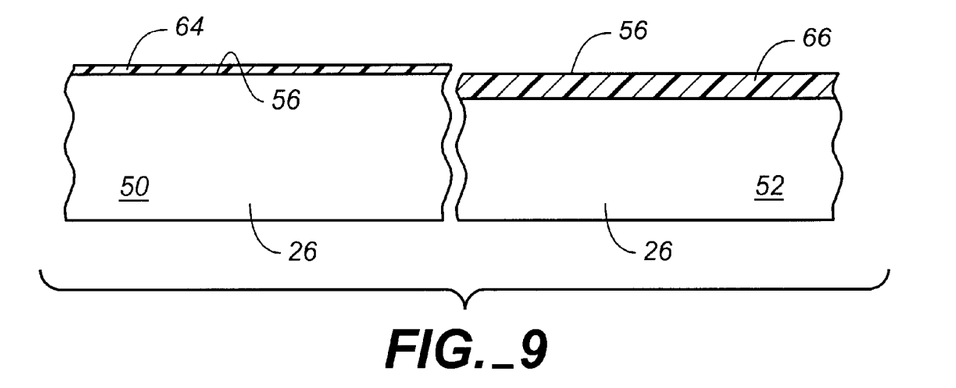

The exposed upper surface 56 of the silicon substrate 26 at the area 52 is next oxidized in a standard oxidation process into a layer 66 of silicon dioxide, as shown in FIG. 9. The oxidation process is timed so that the thickness of the layer 66 results in the desired thickness of the gate insulator 46 of the analog linear transistor 24 (FIG. 1). The oxidation process used in forming a layer 66 has a very minimal oxidizing or three oxidizing effect on the layer 64, because the silicon nitride layer 64 acts as a substantial but not total oxidation barrier. The re-oxidizing effect which does occur at the silicon nitride layer 64 introduces oxygen into the film and produces a beneficial very thin layer of silicon dioxide at the interface surface 56 between the silicon nitride layer 64 and the silicon substrate 26 in the area 50. The slight oxidation of the silicon nitride also has the effect of removing traps and defects that may have been formed in the layer 64 of silicon nitride when it was deposited.

After formation of the thin silicon nitride layer 64 and the relatively thick silicon dioxide layer 66, as previously described, the typical remaining conventional fabrication steps are performed to complete the hybrid IC 20 (FIG. 1). Of course, the silicon nitride layer 64 and the silicon dioxide layer 66 are used to form the gate insulators 36 and 46 for the digital and analog transistors 22 and 24, respectively (FIG. 1).

The process represented by the steps shown in FIGS. 2–9 demonstrate that the silicon nitride layer 64 may be formed compatibly with the silicon dioxide layer 66 in a single semiconductor fabrication process for the gate insulators of both the digital and analog transistors of a hybrid IC. The formation of the silicon nitride layer 64 occurs under circumstances where a silicon dioxide layer 62 (FIG. 7) prevents the silicon nitride from nucleating on the silicon dioxide, thereby confining the silicon nitride to the desired thin gate insulator areas 36 (FIG. 1). Any effect of the silicon nitride on the silicon dioxide layer 62 (FIG. 7) is eliminated by etching away the silicon dioxide layer which existed when the silicon nitride was deposited. In a similar situation, the silicon dioxide layer 66 is grown under the circumstances where the silicon nitride layer 64 is not affected except in a positive manner by enhancing the interface between the silicon nitride and the silicon substrate.

Using the silicon nitride layer 64 for the gate insulators 36 of the digital transistors substantially alleviates leakage current in the thin gate insulators of the digital transistors. A considerably higher proportion of nitrogen, for example more than 20 percent, is present in the silicon nitride gate insulator 36. This higher percentage of nitrogen inhibits direct quantum tunneling of electrons and holes between the gate and the channel of the transistor, thereby diminishing the leakage current. The known disadvantages of using silicon nitride as the gate insulator are avoided, because the layer of silicon nitride used for the gate insulators of the digital transistors is sufficiently thin to avoid the problems caused by thicker layers of silicon nitride. The silicon nitride is not used for the thicker gate insulator of the analog transistors, but instead the more desirable aspects of the thicker silicon dioxide are maintained in the gate insulators of the analog transistors.

Relatively thin gate insulators for the digital transistors may be formed by the same process which also forms relatively thick gate insulators for the analog transistors. Because of the enhanced dielectric capabilities of the silicon nitride, higher analog voltages may be used on the same substrate in a hybrid IC without risking the destruction of the relatively thinner gate insulators of the digital transistors. Many other advantages and improvements will be recognized upon gaining a complete understanding of the present invention.

Presently preferred embodiments of the present invention and many of its improvements have been described with a degree of particularity. This description is of preferred examples of implementing the invention, and is not necessarily intended to limit the scope of the invention. The scope of the invention is defined by the following claims.

The invention claimed is:

1. A hybrid integrated circuit containing high frequency digital switching transistors and analog linear response transistors formed on a silicon substrate wherein each transistor has a gate insulator and the gate insulators of the digital transistors are substantially silicon nitride and the gate insulators of the analog transistors are substantially silicon dioxide.

2. A hybrid IC as defined in claim 1 wherein the silicon dioxide gate insulators of the analog transistors are substantially greater in thickness than the thickness of the silicon nitride gate insulators of the digital transistors.

3. A hybrid IC as defined in claim 2 wherein the thickness of the silicon dioxide gate insulators of the analog transistors is at least 60 angstroms and the thickness of the silicon nitride gate insulators of the digital transistors is in the range of 10–30 angstroms.

4. A hybrid IC as defined in claim 2 further comprising a silicon dioxide interface between the silicon nitride gate insulators and the silicon substrate.

* * * * *